(12) United States Patent
Dandl

(10) Patent No.: US 6,897,616 B2
(45) Date of Patent: May 24, 2005

(54) SLOW-WAVE INDUCTION PLASMA TRANSPORT

(76) Inventor: Raphael A. Dandl, 1122 Calle De Los Serranos, San Marcos, CA (US) 92069

( * ) Notice: Subject to any disclaimer, the term of this patent is extended or adjusted under 35 U.S.C. 154(b) by 321 days.

(21) Appl. No.: 10/175,676

(22) Filed: Jun. 20, 2002

(65) Prior Publication Data
US 2003/0234616 A1 Dec. 25, 2003

(51) Int. Cl.[7] .................................................. H01J 7/24
(52) U.S. Cl. .............................. 315/111.41; 315/111.51
(58) Field of Search ....................... 315/111.21, 111.41, 315/111.51, 111.61; 219/671–672, 674; 156/345.33, 345.41, 345.42, 345.48

(56) References Cited

U.S. PATENT DOCUMENTS

| | | | | |
|---|---|---|---|---|
| 5,234,529 A | * | 8/1993 | Johnson ................. | 156/345.48 |
| 5,580,429 A | * | 12/1996 | Chan et al. ............ | 204/192.38 |
| 6,156,667 A | * | 12/2000 | Jewett ........................ | 438/715 |
| 6,291,938 B1 | * | 9/2001 | Jewett et al. ............ | 315/111.51 |
| 6,392,187 B1 | * | 5/2002 | Johnson ................. | 219/121.43 |
| 2002/0187280 A1 | * | 12/2002 | Johnson et al. ............. | 427/569 |

\* cited by examiner

*Primary Examiner*—Thuy Vinh Tran
(74) *Attorney, Agent, or Firm*—Robert Charles Hill

(57) ABSTRACT

A plasma transport system uses a slow-wave power signal in external radio-frequency (RF) inductors to force plasmas to flow through ducts, such as from a plasma generator to a point of use. A magneto-hydrodynamic force is deliberately created by the RF inductors to displace plasma electrons down along the inside of the ductwork. A charge separation results that both drags the ions along and slows down the electrons with the ion drag. The consequence is that both electrons and ions are motivated down the ductwork and the overall plasma charge stays neutral. A directed stream of energetic ions and neutral gas atoms can be realized. The RF electric fields induced in the plasma tend to counteract any electron cooling and help maintains the plasma electron temperature enough to reduce later reionization power demands.

11 Claims, 4 Drawing Sheets

SLOW-WAVE INDUCTION PLASMA TRANSPORT

BACKGROUND OF THE INVENTION

1. Field of the Invention

The present invention relates to plasma chemistry, and more particularly to devices and methods for transporting and motivating ionized gases which allow a separation of plasma generation and plasma application.

2. Description of Related Art

Plasmas of ionized gases are routinely used in electronics and semiconductor manufacturing. Such plasmas are an almost neutral mix of electrons and ions that will recombine as they cool off. The challenge in many applications is to use the plasmas to do useful work before they cool off. One way to do that is to generate the plasma itself at or near the point of use. But that situation often results in compromises being made between what is best for generating the plasma in the first place and what is best for working the plasma once generated.

It occurs from this that it would be advantageous to generate the plasmas in one area specialized to plasma-generation, and then to move it to an area where it can do its work. But long transportation paths can result in a loss of momentum and a cooling down of the plasma. There is also the problem of how best to pump the plasma from place to place.

Ion-propulsion engines are one form of device that can pump or move plasmas. But conventional ion-propulsion engines are not highly developed yet and their operation is non-ideal. Plasma vacuum pumps have also been developed that use arrays of permanent magnets and electrically biased electrodes. Such plasma vacuum pumps try to force large amounts of plasma and effluent gas into high pressure chambers at super-thermal speed through ducts. Sustaining higher compression ratios seems to require relatively long ducts. But only limited success has been achieved with short ducts. Long ducts suffer too much electron cooling through collisions with neutral gas molecules. The electrically biased electrodes are susceptible to sputtering when exposed to the plasma.

SUMMARY OF THE INVENTION

An object of the present invention is to provide a plasma transportation system that can force a plasma through a duct.

Another object of the present invention is to provide a plasma transportation system and method for high-temperature plasma-chemical reactions.

A further object of the present invention is to provide a directed stream of an electrically neutral mixture of energetic ions, energetic neutral atoms, and electrons for surface modification.

A still further object of the present invention is to provide a plasma processing-chamber effluent-gas pyrolyzation device.

Briefly, a embodiment of the present invention comprises a phased array of inductors disposed along a duct and in which a plasma is introduced. A signal wave generator is connected to the phased array of inductors such that a progressive wave is induced that acts on the plasma to move it in a specified direction.

An advantage of the present invention is that a plasma transportation system and method are provided for forcing plasmas to flow through ducts in a specified direction while maintaining the plasma electron temperature at a high enough value to compensate for plasma loss to recombination.

Another advantage of the present invention is that a plasma transportation system and method are provided for controlled high temperature plasma chemical reactions.

A further advantage of the present invention is that a system and method are provided for plasma processing chamber effluent gas pyrolyzation.

Another advantage of the present invention is that a plasma transportation system and method are provided for generating robust directed streams of electrically neutral mixtures of energetic ions, energetic neutral atoms, and electrons for surface modification.

A still further advantage of the present invention is that a plasma transportation system and method are provided for space propulsion engines.

A further advantage of the present invention is that a system and method are provided for pumping lasers with an efficient coupled pumping medium.

The above and still further objects, features, and advantages of the present invention will become apparent upon consideration of the following detailed description of specific embodiments thereof, especially when taken in conjunction with the accompanying drawings.

DETAILED DESCRIPTION OF THE INVENTION

Figure 1:
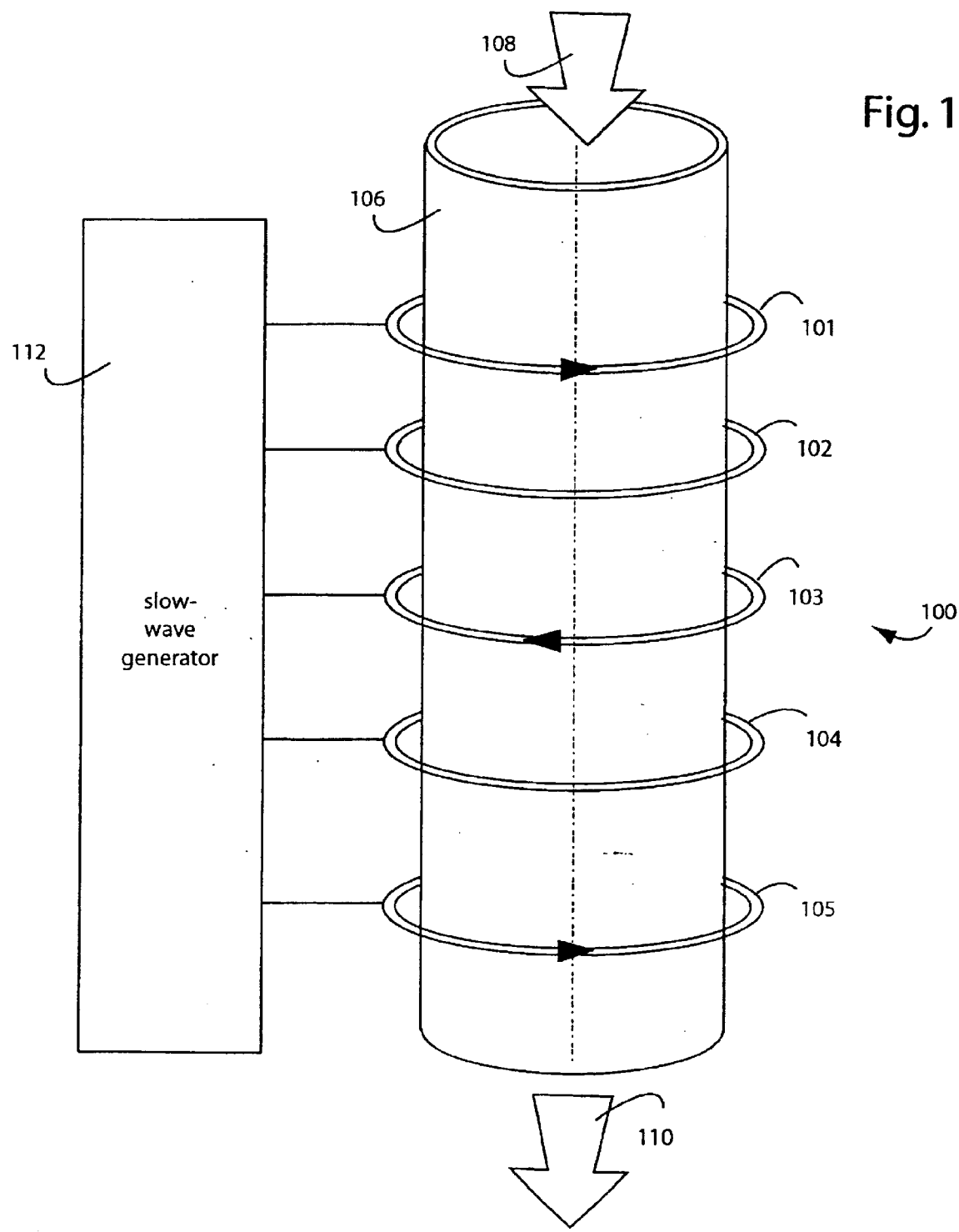
FIG. 1 is a functional block diagram of a plasma transport system embodiment of the present invention that uses a single slow-wave structure.

FIG. 1 represents a plasma transport system embodiment of the present invention, referred to herein by the general reference numeral 100. The system 100 includes a set of five equally spaced coil inductors 101–105 coaxially disposed in a spatial array along the outside of a slow-wave structure 106. The slow-wave structure 106 comprises a hollow cylinder of dielectric material, such as ceramic. The use of five such inductors is simply for illustration in FIG. 1, more such inductors are possible.

An entering plasma and gas mixture 108 at the top is propelled along inside the duct to become an exiting plasma and gas flow 110. A slow-wave generator 112 produces five sets of signal waveforms to the inductors 101–105 that cooperate to move the plasma and gases along inside. The signal phases between the outputs of the slow-wave generator 112 are separated by $$\frac{\pi}{2}.$$

The slow-wave generator 112 drives the plasma and gases along inside by generating five phased RF drive currents, respectively, in each of the five equally spaced coil inductors 101–105, e.g., as in Table I.

TABLE I $$I_1 = |I_1|\cos(\omega t + \phi 1)$$
$$I_2 = |I_2|\cos\left(\omega t + \phi 1 - \frac{\pi}{2}\right)$$
$$I_3 = |I_3|\cos(\omega t + \phi 1 - \pi)$$
$$I_4 = |I_4|\cos\left(\omega t + \phi 1 - \frac{3\pi}{2}\right)$$
$$I_5 = |I_5|\cos(\omega t + \phi 1 - 2\pi)$$

where,
$I_1$ is the current in coil 101;
$I_2$ is the current in coil 102;
$I_3$ is the current in coil 103;
$I_4$ is the current in coil 104; and
$I_5$ is the current in coil 105.

In FIG. 1, the circulating directions these currents take at one arbitrary instant is represented by the right arrows on coils 101 and 105, and by the left arrow on coil 103. At such instant, an RF magnetic field in front of inductor 102 is directly radially inward toward the core of slow-wave structure 106, and since the current in coil 102 is phase shifted by $\pi/2$ from coil 101, the RF electric field $E_\phi$ under it is azimuthal. An azimuthally directed current, $j_\phi = \sigma E_\phi$, flows in response. The magnitude of such induced current depends on the plasma electrical conductivity, $\sigma$, and the induced electric field.

A magnetohydrodynamic (MHD) force, $F=(j)(B)$, has both axial and radial components, e.g., $F_r$ and $F_z$, because the RF magnetic field also has axial and radial components to it. So, the axial force, $F_z = -j_\phi B_r$, remains the same even though the induced current, j, changes sign during alternate halves of its signal waveform from generator 112. This is because the radial component of the RF magnetic field, Br, changes its sign too. The two negatives multiply to become a positive.

Therefore, even though the circulating directions of these currents at the one arbitrary instant shown by the right arrows on coils 101 and 105 and the left arrow on coil 103 are different, the axial force $F_z$ generated by each coil is in harmony. For example, from the top to the bottom of the duct 106 in FIG. 1. It follows that over all moments in time, the axial force is in the same single direction.

Figure 2:
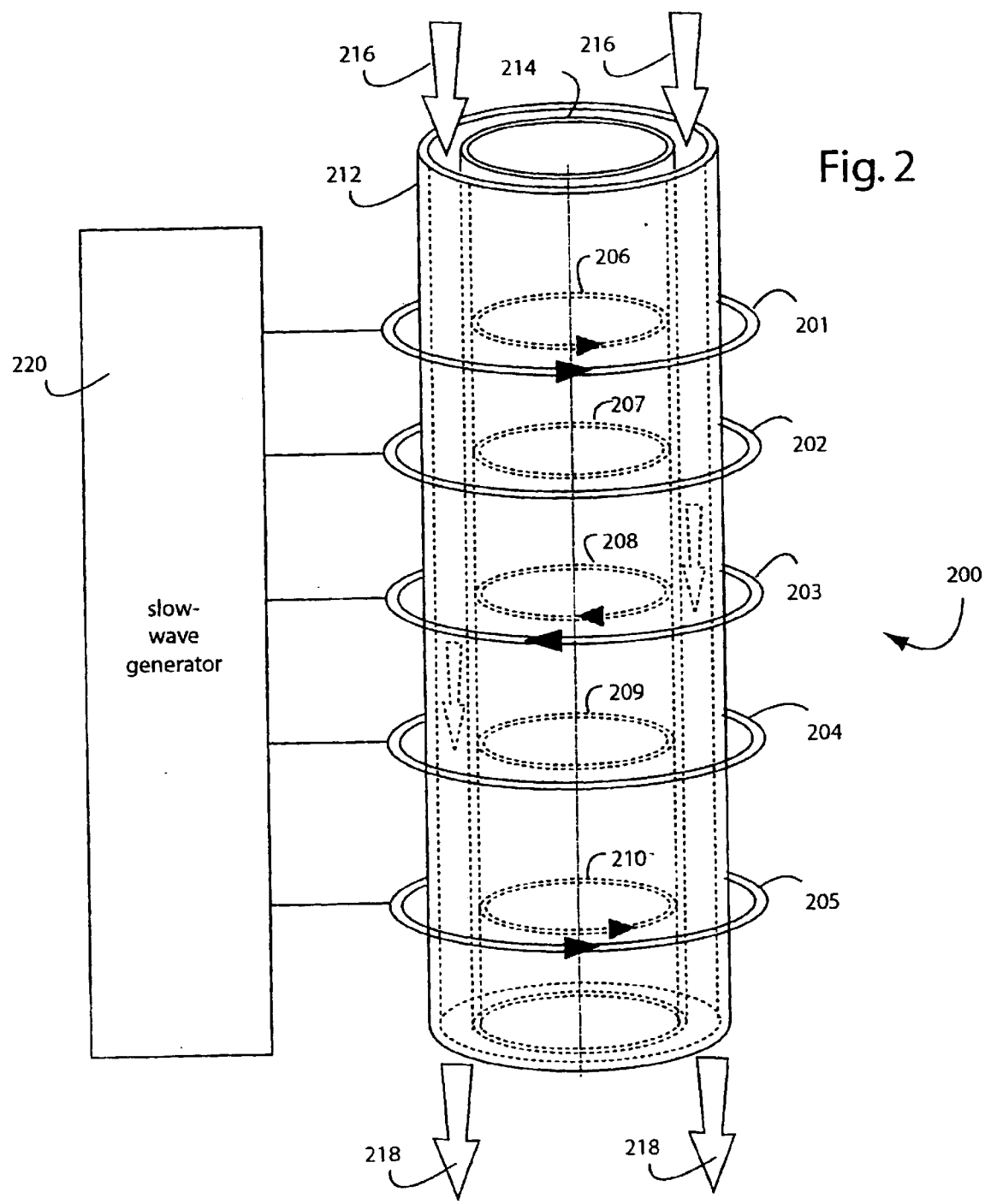
FIG. 2 is a functional block diagram of another plasma transport system embodiment of the present invention that uses inner and outer slow-wave structures.

FIG. 2 illustrates another plasma transport system embodiment of the present invention, referred to herein by the general reference numeral 200. Here, a smaller dielectric hollow cylinder is disposed within a second one with a larger diameter. Such configuration minimizes the axial magnetic field components for more efficient axial transport. The plasma and gas flow is conducted between the inner walls of the outer cylinder and the outer walls of the inner cylinder. For example, the system 200 includes a first set of five equally spaced outer coil inductors 201–205, and five equally spaced inner coil inductors 206–210. The outer coil inductors 201–205 are mounted to the outside surface of an outside slow-wave structure 212, and the inner coil inductors 206–210 are mounted to the inside surface of an inside slow-wave structure 214. The inner coils can be axially displaced to generate a radially inward force when such is required. A plasma and gas flow 116 enters between and exits at the bottom as a plasma and gas flow 218. A slow-wave generator 220 drives the coil inductors 201–210. More than five such pairs of inner and outer coils can be used in alternative embodiments of the present invention.

The currents fed by the slow-wave generator 220 are the same for each pair of coils, 201 and 206, 202 and 207, 203 and 208, 204 and 209, and 205 and 210. Such currents are referred to here as $I_1 \ldots I_{10}$, and are phase-related as in Table II.

TABLE II $$I_1 + I_6 = 2I \cos \omega t;$$
$$I_2 + I_7 = 2\sqrt{2} I \cos \left(\omega t + \frac{\pi}{2}\right);$$
$$I_3 + I_8 = 4I \cos (\omega t + \pi);$$
$$I_4 + I_9 = 2I\sqrt{2} \cos \left(\omega t + \frac{3\pi}{2}\right); \text{ and}$$
$$I_5 + I_{10} = 2I \cos (\omega t + 2\pi).$$

One way to analyze how this works is to neglect the wire curvature for the magnetic field calculation so the induced electric field can be calculated from the mutual inductance $M_{jz}$ of the virtual coils formed by the coil pairs in the slow-wave structure areas. It is also assumed for a moment there is no plasma present. The azimuthal electric field is thus the sum over all the coils 210–210, e.g., $$E_\phi = M_{rz} \frac{\left(\frac{dI}{dt}\right)}{2\pi r}.$$

Figure 3:
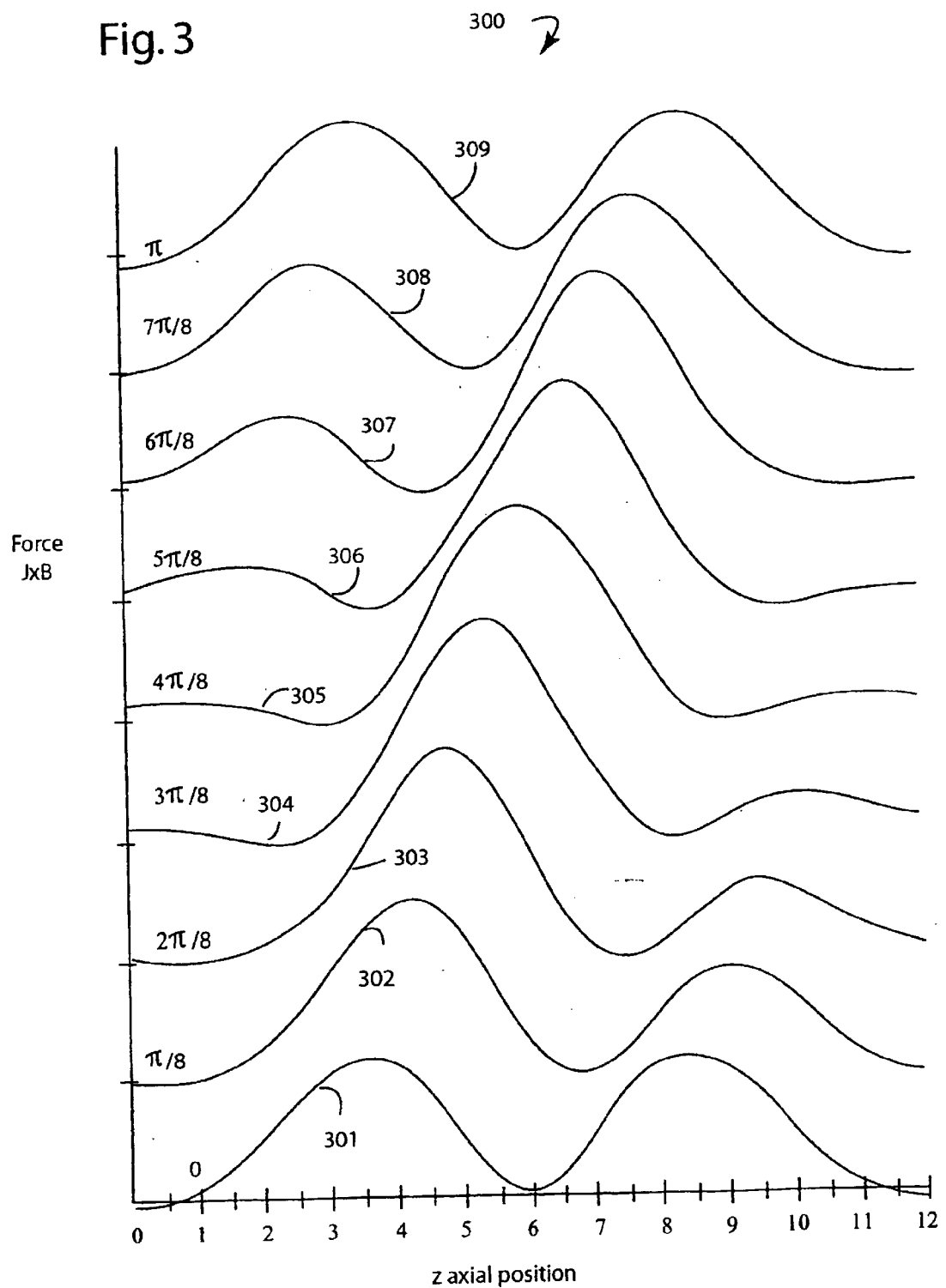
FIG. 3 is a graph that plots the magnetohydrodynamic force, J×B, versus the axial z-position for each of several phases.

FIG. 3 plots a calculated set of waveforms 300 of the $j_\phi \times B_r$ force along "z" as a function of axial position for a number of phases ranging from 0 to $\pi$ radians in steps of $\pi/8$. A 0-phase waveform 301 is shown at the bottom. It produces a force J×B that varies as the axial position, "z", along the length of the slow-wave structure. A next $\pi/8$-phase waveform 302 follows, as do waveforms 303–309 that are each shifted in phase by $\pi/8$ from the previous one.

In FIG. 3, the horizontal axis is plasma flow and the vertical segments indicate the force of the wavelets, where ordinate tick marks in the Figure near the start of each wavelet show the zero-force level for the respective wavelet. The multiple waves are the different wavelet phases, which vary in steps of $\pi/8$ from 0 to $\pi$. In the center of the duct, the axial force is positive for almost all times and axial positions, and the force frequency is twice that of the applied RF-power.

The identification of $-E_\phi B_r$ with the axial component of the MHD force on the plasma electrons stems from the assumptions that the current density $j_\phi = \sigma E_\phi$, and the plasma conductivity is constant. The spatial patterns repeat every half period of the RF power. The axial forces can be optimized for larger loop arrays by tapering the magneto-motive-force of the loops. Ferromagnetic pole pieces can be added and extra coil turns can be added to shape force direction and help with load-impedance matching of the RF source to the plasma.

Such physical mechanism is equivalent to ambipolar devices that have bounded plasmas with equal loss rates of ions and electrons. The applied RF-power and the number of inductors can be varied to control the difference in potential, one-to-end. Singly charged ions emerging from the duct outlets take on such differences in potential as part of their maximum kinetic energy (in electron-volts). Similar arrays can be constructed in alternative embodiments of the present invention to provide radial and azimuthal transport to create plasma pancakes and rotating plasma cylindrical shells.

The electrical conductivity, $\sigma$, of a weakly ionized plasma has an important effect on transport process. The propagation of RF electromagnetic waves at frequencies below the electron plasma frequency is evanescent. The wave amplitude decreases exponentially with the separation distance from the inductors. These have a characteristic e-folding length, the so-called "skin depth", given by $$d = (\mu_0 \omega \sigma)^{-\frac{1}{2}};$$

where $\mu_0$ is the permeability of free space, and $\omega=2\pi f$ is the radian RF energy.

The RF-power is deposited as heat in a unit volume of plasma at the instantaneous rate of $$\frac{P}{\text{volume}} = j \cdot E = \sigma E^2.$$

The MHD force on a unit volume of electron fluid is proportional to the plasma conductivity, $$\frac{F}{\text{volume}} = j \times B = \sigma E \times b.$$

In steady state, the axial component of the MHD force is balanced by an electrostatic field, Ez, as given by $(en_e)E_z = \sigma E_\phi B_r$.

The electrical conductivity of a weakly ionized plasma can be estimated using a "free-path" approach. See for example, H. Alfven and C. Falthammar, *Cosmical Electrodynamics*, second edition, Oxford, 1963, pp. 146 ff. Such conductivity depends on the electron density, $n_e$, and the mean-free-path for collisions with neutral gas molecules, $\lambda$, as in, $$\sigma = \left(\frac{e^2}{m_e}\right) n_e \frac{\lambda}{2Ve}.$$

Here, e is the electron charge, $m_e$ is the mass, and $v_e$ is the thermal speed. The mean-free-path for collisions with gas molecules depends on the density, no, and the type of gas in a Chapman and Cowling relation, $$\lambda = \left(2^{\frac{1}{2}} \pi n_o \delta^2\right)^{-1}.$$

Where, $\delta$ is the diameter of the molecule as discussed by S. Dushman, in *Scientific Foundations of Vacuum Technologies*, Second Edition, J. M. Lafferty, Editor, John Wiley & Sons, New York, 1962, p. 32.

The foregoing can be combined to yield an expression for the electrical conductivity, $$\sigma = \left(\frac{e^2}{m_e}\right)\left(\frac{n_e}{n_o}\right)\left(2^{\frac{1}{2}} \pi Ve \delta^2\right)^{-1}.$$

From this can be found $$j_\phi = \sigma E_\phi, \frac{F_z}{\text{volume}} = -\sigma E_\phi B_r, \frac{<P>}{\text{volume}} = \sigma \frac{E_\phi^2}{2}, \text{ and } E_z = \frac{\sigma E_\phi B_r}{(en_e)}.$$

The rate at which the plasma loses energy by inelastic collisions with neutral atoms is determined by the reaction rate coefficient $<\sigma v_e>_x$, $$\frac{P_x}{\text{volume}} = n_e n_o <\sigma Ve>_x E_x.$$

Where the subscript x denotes atomic excitation and de-excitation processes. The rate coefficient depends on the type of gas and the electron temperature.

Figure 4:
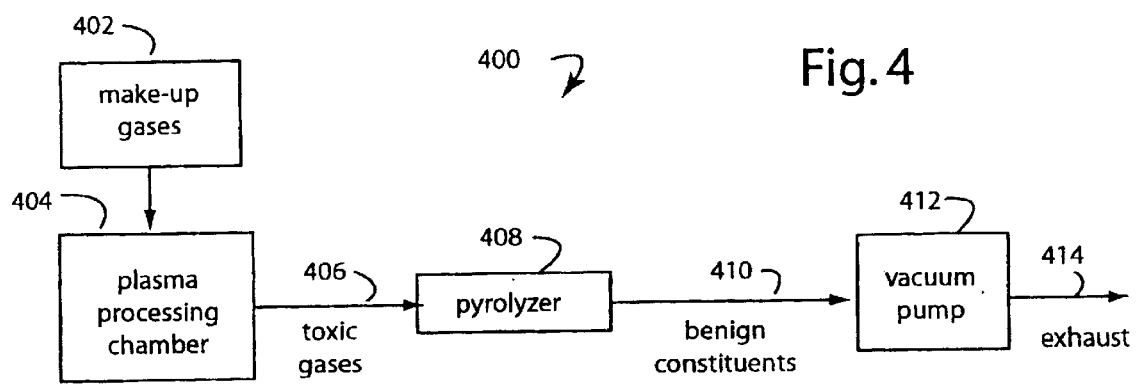
FIG. 4 illustrates a plasma processing system with a pyrolyzer to clean up the effluent gases in one embodiment of the present invention.

FIG. 4 illustrates a processing system 400 in one embodiment of the present invention. The system 400 comprises a make-up gas source 402 that balances effluent losses that occur in a plasma processing chamber 404. An effluent flow 406 includes toxic gases that must be decomposed before being released or otherwise exhausted. A pyrolyzer 408 converts such toxic gases into more benign constituents that are taken away in an effluent flow 410. In particular, the transporter itself pyrolyzes while carrying effluent to an exhaust pump. A vacuum pump 412 helps maintain the near vacuum required inside the plasma processing chamber 404. A released exhaust 414 is practically free of toxic gases. The pyrolyzer 408 is constructed like the plasma transport systems 100 and 200 shown in FIGS. 1 and 2, respectively. Enough high powered RF-energy is fed in from the waveform generators to pyrolyze the gases flowing through. The duct length is also extended far enough to allow for sufficient heating and pyrolyzation to occur.

Embodiments of the present invention are particularly well suited in applications using gas pressures on the order of 10-mTorr, corresponding to $n_o=3.5\times10^{14}/\text{cm}^3$. For an argon plasma, the electron density can be assumed to be $n_e=3.5\times10^{11}/\text{cm}^3$, such that $n_e/n_o=0.001$, then the diameter of the argon atom according to Dushman is $\delta=3.67\times10^{-10}$ meters. Electron temperatures in weakly ionized plasmas in this pressure regime are typically 3–4 eV, so $V_e=1.45\times10^6$ m/sec. It is somewhat arbitrarily assumed that $E_\phi=500$ V/m, and $B_r=5$ Gauss. The conductivity, $$\sigma = 1.6 \times 10^4 \left(\frac{n_e}{n_o}\right)(\text{Ohm m})^{-1} = 16 \text{ (Ohm m)}^{-1},$$

is proportional to the degree of ionization. The "skin depth" is $$d = [0.079 f (n_e/n_o)\text{sec}/\text{m}^2]^{-\frac{1}{2}}.$$

For example, waves with an RF frequency of 3.0 MHz have a skin depth of 5-cm.

The plasma current density for this case is $j_\phi=1.6$ A/cm$^2$ $(n_e/n_o)E_\phi=0.8$ Amp/cm$^2$, and the RF electric field is in units of Volts/m. The MHD force per unit volume for this argon plasma is F/volume=$1.6\times10^{-6}$ N/cm$^3$ $(n_e/n_o) E_\phi B_r=0.4$ dyne/cm$^3$, provided Br is in Gauss and the RF electric field is in units of Volts/m. In steady state, such force is balanced by an electrostatic force created by the space charge separation generated by displacing the electrons. A resulting axial electric field is the steady state condition in which the two forces come into balance, F/volume=$en_e$ $E_z=1.6\times10^{-6}$ N/cm$^3$ $(n_e/n_o)E_\phi B_r$, from which $E_z=1.0\times10^{13}$ $n_o^{-1}$ $E_\phi B_r$ V/m=71 V/m.

The time-averaged power deposited in the plasma by the induced radio frequency electric field is <P>/volume=$8\times10^{-3}$ W/cm$^3$ $(n_e/n_o)E_\phi^2=2$ W/cm$^3$., where $E_\phi$ is in Volts/m. The rate at which electrons lose energy through collisions with neutral argon atoms is $P_x$/volume=$n_e/n_o$ $<\sigma v_e>_x E_x=0.6$ W/cm$^3$. For argon plasmas with electron temperatures of 3–4 eV, $<\sigma v_e>_x=2.75\times10^{-9}$ cm$^3$/sec and $E_x=11$ eV.

Although particular embodiments of the present invention have been described and illustrated, such is not intended to limit the invention. Modifications and changes will no doubt become apparent to those skilled in the art, and it is intended that the invention only be limited by the scope of the appended claims.

What is claimed is:

1. A method for transporting a plasma down a duct, the method comprising the steps of:
   inducing an electron current in said plasma;
   inducing an RF magnetic field in said plasma through a set of coil inductors coaxially and equally spaced disposed along the duct;
   wherein, an interaction between said electron current and said RF magnetic field is such that a magnetohydrodynamic (MHD), j×B, is created that moves said plasma down the duct in one direction.

2. The method of claim 1, further comprising a step of:
   generating said RF magnetic field with an alternating current RF power signal applied to a series of inductors disposed along said duct.

3. The method of claim 2, further comprising a step of:
   sequencing said alternating current RF power signal applied to said series of inductors such that when electrons in said plasma move they leave behind excess ions that set up a local electric field that drags ions along;
   wherein, a background neutral gas is moved by successive charge exchanges with transporting ions.

4. A method for transporting ionized gas plasmas, the method comprising the steps of:
   generating a progressive, inductive slow wave;
   passing a plasma coaxially through a cylindrical conduit from an input to an output;
   winding said conduit with a number of progressively phased inductors; and
   powering successive ones of said inductors with samples of said inductive slow wave such that said plasma is longitudinally motivated in one direction inside said cylindrical conduit;
   wherein, a phased array of inductors induce RF electric currents inside the conduit that drives currents in the plasma electrons that are synchronously phased with induced RF magnetic fields so that a force on the electron currents has the same direction at all times of operation.

5. The method of claim 4, further comprising a step of:
   choosing a direction in which to move the plasma and adjusting said inductive slow wave to effectuate the chosen direction.

6. The method of claim 4, further comprising a step of:
   exerting a unidirectional transportation force on electrons in a ionized gas plasma with the induced RF magnetic fields from a proximate phased-array of inductors.

7. The method of claim 4, further comprising a step of:
   forcing electrons in a ionized gas plasma to constantly move in a single direction with the induced RF magnetic fields generated from a proximate and coaxial phased-array of inductors;
   wherein, said electrons when moved leave an excess of positive ions behind in their wakes that sets up local electric fields which drag said ions along with said electrons to move at a common velocity.

8. The method of claim 4, further comprising a step of:
   varying the power to each of said inductors in the step of powering.

9. A peristaltic plasma transporter, comprising:
   a duct for conducting a plasma;
   a phased-array of RF inductors linearly disposed between first and second points of the duct; and
   a power source for electrically driving individual ones of the RF inductors with a phase that increases with each succeeding inductor to create a peristaltic motion on said plasma;
   wherein, said phased-array of RF inductors are synchronously phased to induce an RF electric current inside said duct that drives plasma electron currents with induced RF magnetic fields that a force on the electron currents has the same direction at all times of operation.

10. A plasma transporter, comprising:
    a hollow cylindrical conduit comprised of dielectric material;
    a plasma-source opening at a first end of the cylindrical conduit;
    a plasma-output opening at a second, opposite end of the cylindrical conduit;
    a longitudinal phased-array of ring-shaped inductors coaxially disposed about the cylindrical conduit between said first and second ends; and
    a power source for electrically driving individual ones of the ring-shaped inductors with a phase that increases with each succeeding inductor;
    wherein, said phased array of inductors are synchronously phased to induce an RF electric current inside said conduit that drives plasma electron currents with induced RF magnetic fields that a force on the electron currents has the same direction at all times of operation.

11. A method for transporting a plasma, the method comprising the steps of:
    inducing an electron current in a plasma;
    inducing an RF magnetic field in said plasma;
    wherein, an interaction between said electron current and said RF magnetic field is such that a magnetohydrodynamic (MHD), j×B, is created that moves said plasma down a duct in one direction; and
    generating said RF magnetic field with a phased array of inductors disposed along said duct.

* * * * *